(12) United States Patent
Wang

(10) Patent No.: US 11,108,020 B2
(45) Date of Patent: Aug. 31, 2021

(54) FLEXIBLE DISPLAY PANEL HAVING BLOCKING WALLS

(71) Applicant: BOE Technology Group Co., Ltd., Beijing (CN)

(72) Inventor: Tao Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 14 days.

(21) Appl. No.: 16/632,926

(22) PCT Filed: Jul. 17, 2019

(86) PCT No.: PCT/CN2019/096279
§ 371 (c)(1),
(2) Date: Jan. 22, 2020

(87) PCT Pub. No.: WO2020/020023
PCT Pub. Date: Jan. 30, 2020

(65) Prior Publication Data
US 2021/0066649 A1    Mar. 4, 2021

(30) Foreign Application Priority Data

Jul. 27, 2018  (CN) .......................... 201810847114.8

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 51/0097* (2013.01); *H01L 27/3244* (2013.01); *H01L 2251/5338* (2013.01)

(58) Field of Classification Search
CPC ............. H01L 51/5253; H01L 51/0097; H01L 27/3244; H01L 2251/5338
See application file for complete search history.

(56) References Cited

U.S. PATENT DOCUMENTS 10,606,129 B2 *   3/2020   Lee ................... G02F 1/133512
10,930,887 B2 *   2/2021   Lee ......................... H01L 51/56
(Continued)

FOREIGN PATENT DOCUMENTS

| CN | 106784377 A | 5/2017 |
| CN | 106847858 A | 6/2017 |

(Continued)

OTHER PUBLICATIONS

Chinese Office Action for corresponding application 201810847114.8 dated May 21, 2020.

*Primary Examiner* — Ida M Soward
(74) *Attorney, Agent, or Firm* — Arent Fox LLP; Michael Fainberg

(57) ABSTRACT

A flexible display panel and a display device. The flexible display panel includes a flexible substrate having a display area and a non-display area surrounding the display area; the display panel also includes at least one blocking wall located on the non-display area and surrounding the display area, a light-emitting structure located on the display area, and a packaging film covering the light-emitting structure and the blocking wall; the flexible display panel has a bending area and a non-bending area, and the thickness of the parts, in the bending area, of the blocking wall is not equal to the thickness of the parts, in the non-bending area, of the blocking wall.

18 Claims, 9 Drawing Sheets

(56) References Cited

U.S. PATENT DOCUMENTS

| | | | |
|---|---|---|---|
| 2017/0125734 A1* | 5/2017 | Lee | H01L 27/3246 |
| 2017/0155082 A1* | 6/2017 | Mu | H01L 51/5293 |
| 2017/0229674 A1 | 8/2017 | Jin et al. | |
| 2018/0366529 A1* | 12/2018 | Lee | H01L 51/0031 |
| 2019/0019976 A1* | 1/2019 | Kim | H01L 51/5203 |
| 2019/0043930 A1 | 2/2019 | Wang et al. | |
| 2019/0157619 A1 | 5/2019 | Lee et al. | |

FOREIGN PATENT DOCUMENTS

| | | |
|---|---|---|
| CN | 106997930 A | 8/2017 |
| CN | 107170792 A | 9/2017 |
| CN | 107482038 A | 12/2017 |
| CN | 107507849 A | 12/2017 |

* cited by examiner

FLEXIBLE DISPLAY PANEL HAVING BLOCKING WALLS

CROSS-REFERENCE TO RELATED APPLICATION

The application is a National Stage of International Application No. PCT/CN2019/096279, filed on Jul. 17, 2019, which claims the priority of the Chinese patent application submitted to the China Patent Office on Jul. 27, 2018, with application No. 201810847114.8 and application name "Flexible Display Panel and Display Device", all of which are incorporated in the application by reference.

FIELD

The disclosure relates to the technical field of display, in particular to a flexible display panel and a display device.

BACKGROUND

At present, OLED (Organic Light-Emitting Diode) devices are considered to be the most potential flat panel display devices, and the technology is also considered to be the most likely display technology to be adopted for manufacturing flexible display devices.

An existing flexible display panel generally includes: a flexible substrate, a non-display area of which is provided with blocking walls, a light-emitting structure located in a display area of the flexible substrate, and a packaging film covering the light-emitting structure and the blocking walls, the packaging film is generally made of multiple organic and inorganic layers stacked, wherein the inorganic layers realize the function of blocking water and oxygen while the organic layers realize the function of flattening, and the blocking walls are mainly used as cut-off layers of the organic layers.

SUMMARY

The flexible display panel provided by some embodiments of the present disclosure includes a flexible substrate having a display area and a non-display area surrounding the display area; the display panel also includes at least one blocking wall located on the non-display area and surrounding the display area, a light-emitting structure located on the display area, and a packaging film covering the light-emitting structure and the blocking wall;

the flexible display panel has a bending area and non-bending areas, and a thickness of the parts, in the bending area, of the blocking wall is not equal to a thickness of the parts, in the non-bending areas, of the blocking wall.

Alternatively, in the flexible display panel provided by some embodiments of the present disclosure, when the flexible display panel is bent to the side, away from the packaging film, of the flexible substrate, the thickness of the parts, in the bending area, of the blocking wall is less than the thickness of the parts, in the non-bending areas, of the blocking wall; or, when the flexible display panel is bent to the side, away from the flexible substrate, of the packaging film, the thickness of the parts, in the bending area, of the blocking wall is greater than the thickness of the parts, in the non-bending areas, of the blocking wall.

Alternatively, in the flexible display panel provided by some embodiments of the disclosure, the distance between the part, in the bending area, of the blocking wall and the edge of the flexible substrate is greater than the distance between the part, in the non-bending areas, of the blocking wall and the edge of the flexible substrate.

Alternatively, in the flexible display panel provided by some embodiments of the present disclosure, the parts, in the bending area, of the blocking walls are in an arc shape.

Alternatively, in the flexible display panel provided by some embodiments of the present disclosure, two blocking walls are included, and the two blocking walls are each in a continuous closed ring shape.

Alternatively, in the flexible display panel provided by some embodiments of the present disclosure, the two blocking walls are included, and at least one of the blocking walls is composed of a plurality of blocking wall segments arranged at intervals.

Alternatively, in the flexible display panel provided by some embodiments of the present disclosure, an inside blocking walls of the two blocking walls is in the continuous ring shape, and an outside blocking walls of the two blocking walls is composed of the blocking wall segments arranged at intervals.

Alternatively, in the flexible display panel provided by some embodiments of the present disclosure, the part, in the bending area, of the outside blocking wall is composed of the blocking wall segments arranged at intervals.

Alternatively, in the flexible display panel provided by some embodiments of the present disclosure, the two blocking walls are composed of the blocking wall segments arranged at intervals.

Alternatively, in the flexible display panel provided by some embodiments of the present disclosure, the parts, in the bending area, of the two of blocking walls are composed of the multiple blocking wall segments arranged at intervals.

Alternatively, in the flexible display panel provided by some embodiments of the present disclosure, the outside blocking wall is in the continuous ring shape, and the inside blocking wall is composed of the multiple blocking wall segments arranged at intervals.

Alternatively, in the flexible display panel provided by some embodiments of the present disclosure, the part, in the bending area, of the inside blocking wall is composed of the blocking wall segments arranged at intervals.

Alternatively, in the flexible display panel provided by some embodiments of the present disclosure, the thickness of the blocking wall is 0.5 µm~2 µm.

Alternatively, in the flexible display panel provided by some embodiments of the present disclosure, the width of the blocking wall is 10 µm~90 µm.

Alternatively, in the flexible display panel provided by some embodiments of the present disclosure, a plurality of blocking walls are included, at least one of the blocking walls is composed of the multiple blocking wall segments arranged at intervals, and gaps between the blocking wall segments correspond to continuous parts of at least one of the blocking walls.

Alternatively, in the flexible display panel provided by some embodiments of the present disclosure, the packaging film includes at least one organic layer and at least one inorganic layer stacked alternately;

the organic layer covers the display area, and the inorganic layer covers the display area and the blocking walls.

Alternatively, in the flexible display panel provided by some embodiments of the present disclosure, the distance between the parts, in the bending area, of the inorganic layer and the edge of the flexible substrate is greater than the distance between the parts, in the non-bending areas, of the inorganic layer and the edge of the flexible substrate.

Accordingly, the embodiment of the disclosure also provides the display device, including any of the above flexible display panel provided by some embodiments of the disclosure.

BRIEF DESCRIPTION OF THE DRAWINGS

FIG. 1b is a sectional structural diagram of the flexible display panel along a-a' direction shown in FIG. 1a;

FIG. 2a is a sectional structural diagram of the flexible display panel along the b-b' direction shown in FIG. 1a;

FIG. 2b is another sectional structural diagram of the flexible display panel along the b-b' direction shown in FIG. 1a;

DETAILED DESCRIPTION OF THE EMBODIMENTS

Figure 1A:
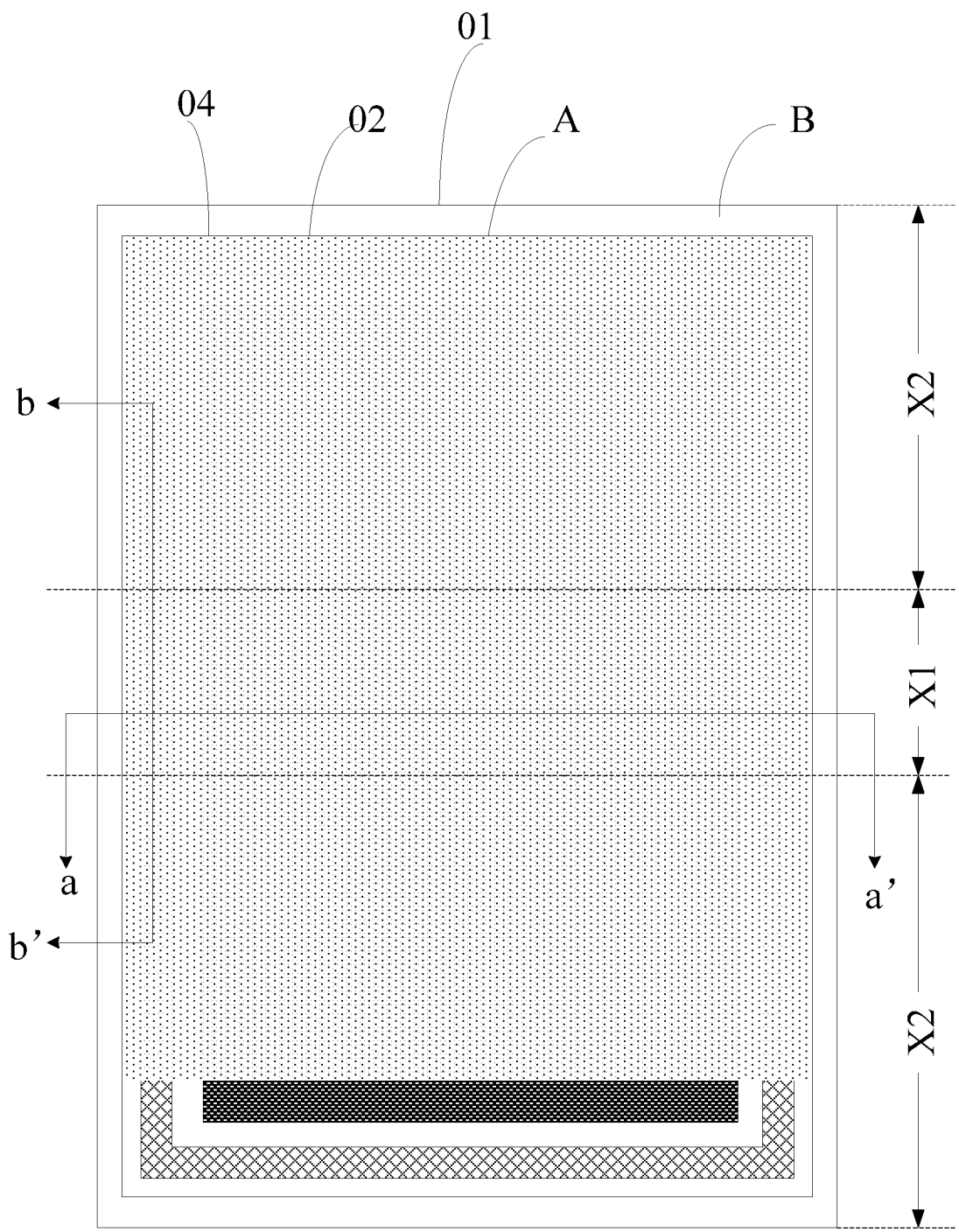
FIG. 1a is a top view structural diagram of a flexible display panel provided by an embodiment of the present disclosure.

In order to make the purpose, technical scheme and advantages of the disclosure clearer, the disclosure will be further described in detail below in combination with the accompanying drawings. Obviously, the described embodiments are only part of the embodiments of the disclosure. Based on the embodiments in the disclosure, all other embodiments obtained by those skilled in the art without creative labor belong to the scope of protection of the disclosure.

The shapes and sizes of the parts in the drawings do not reflect the true proportions, and are only intended to illustrate the disclosure.

Figure 1B:
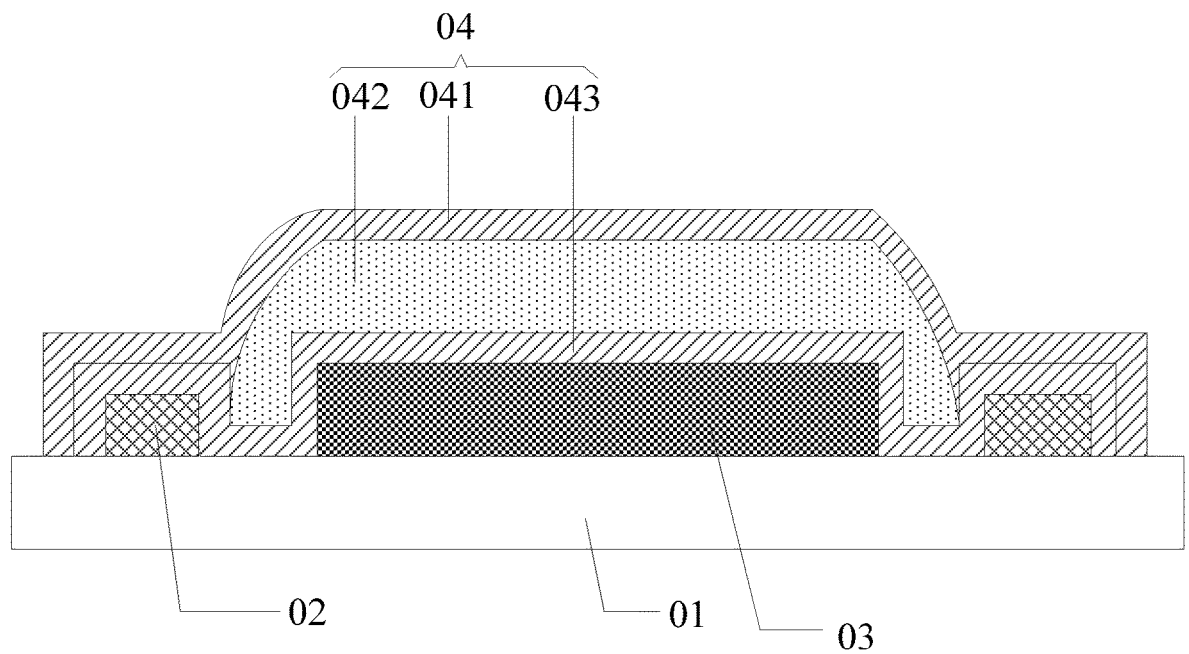

A flexible display panel provided by some embodiments of the present disclosure, as shown in FIG. 1a and FIG. 1b, includes: a flexible substrate 01 having a display area A and a non-display area B surrounding the display area A; the non-display area B has at least one circle of blocking wall 02 surrounding the display area A, and the display area A is provided with a light-emitting structure 03 (not shown in FIG. 1a); and the flexible display panel also includes a packaging film 04 covering the light-emitting structure 03 and the blocking walls 02.

Figure 2A:
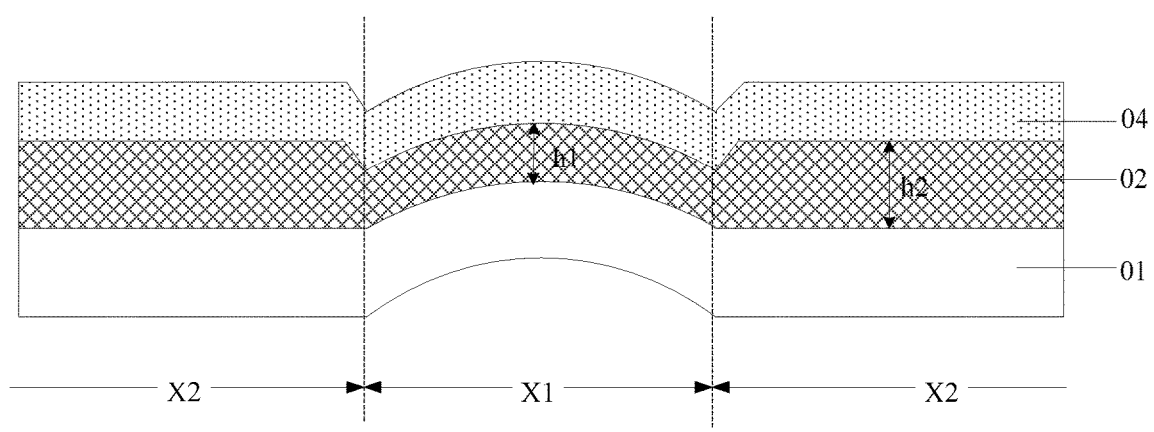
Figure 2B:
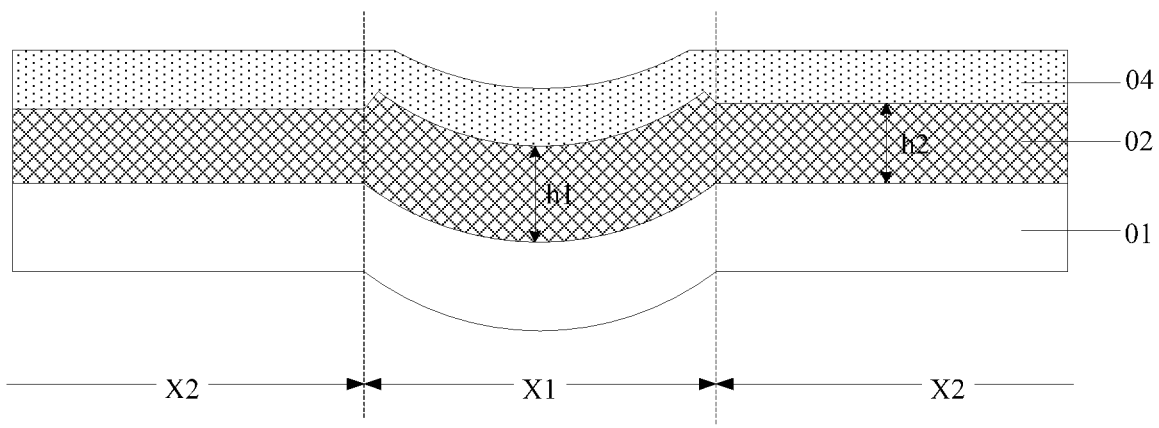

The flexible display panel has a bending area X1 and non-bending areas X2 as shown in FIG. 2a and FIG. 2b, the thickness h1 of the parts, in the bending area X1, of the blocking walls 02 is not equal to the thickness h2 of the parts, in the non-bending areas X2, of the blocking walls 02.

In the flexible display panel provided by some embodiments of the disclosure, the thickness of the parts, in the bending area, of the blocking walls and the thickness of the parts, in the non-bending areas, of the blocking walls are set to be unequal, through the thickness difference, the stress on the blocking walls in the bending area can be reduced, and thus the probability of cracks in the packaging film can be lowered.

In specific implementation, as shown in FIG. 2a, when the flexible display panel is bent to the side, away from the packaging film 04, of the flexible substrate 01, the thickness h1 of the parts, in the bending area X1, of the blocking walls 02 is less than the thickness h2 of the parts, in the non-bending areas X2, of the blocking walls 02.

Or, in specific implementation, as shown in FIG. 2b, when the flexible display panel is bent to the side, away from the flexible substrate 01, of the packaging film 04, the thickness h1 of the parts, in the bending area X1, of the blocking walls 02 is greater than the thickness h2 of the parts, in the non-bending areas X2, of the blocking walls 02.

In specific implementation, the packaging film is generally composed of multiple organic and inorganic layers stacked, wherein the inorganic layers are used to realize the function of blocking water and oxygen. However, the inorganic layers are relatively brittle and have poor stretching performance, and their ability to bear compression force is relatively slightly better than the stretching ability. Therefore, in the bending process of the display panel where an outer layer is stretched and an inner layer is compressed, there is bound to be a transition layer on its cross section that is neither being stretched nor compressed, and the stress is almost equal to zero. This transition layer is called neutral layer.

In the flexible display panel provided by some embodiments of the present disclosure, when the display panel is bent to the side, away from the packaging film, of the flexible substrate, the packaging film is in a stretched state, and since the thickness of the blocking walls in the bending area is less than the thickness of the blocking walls in the non-bending areas, the part, in the bending area, of the packaging film is closer to the neutral layer than the parts, in the non-bending areas, of the packaging film, thereby reducing the stretching stress on the packaging film in the bending area for lowering the probability of the cracks in the packaging film. When the display panel is bent to the side, away from the flexible substrate, of the packaging film, the packaging film is in a compressed state, and since the thickness of the blocking walls in the bending area is greater than the thickness of the blocking walls in the non-bending areas, the part, in the bending area, of the packaging film is closer to the neutral layer than the parts, in the non-bending areas, of the packaging film, thereby reducing the compressing stress on the packaging film in the bending area for lowering the probability of the cracks in the packaging film.

Figure 3A:
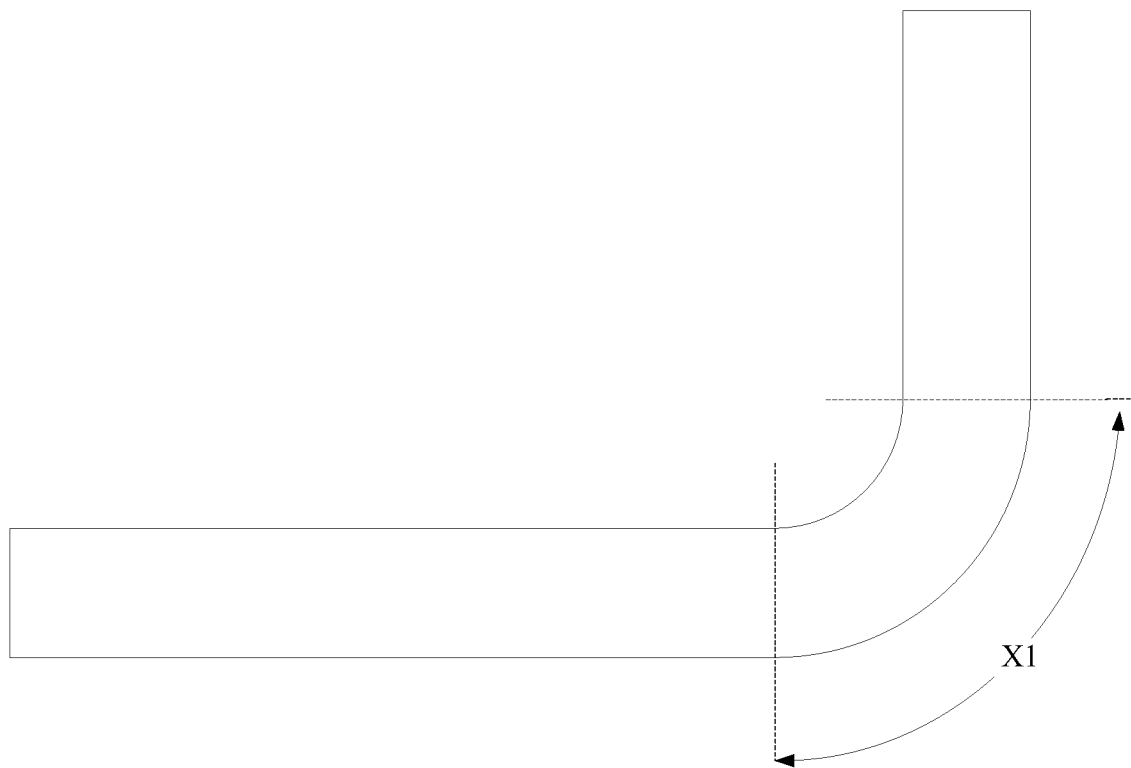
FIG. 3a is a bending diagram of the flexible display panel provided by some embodiments of the present disclosure.
Figure 3B:
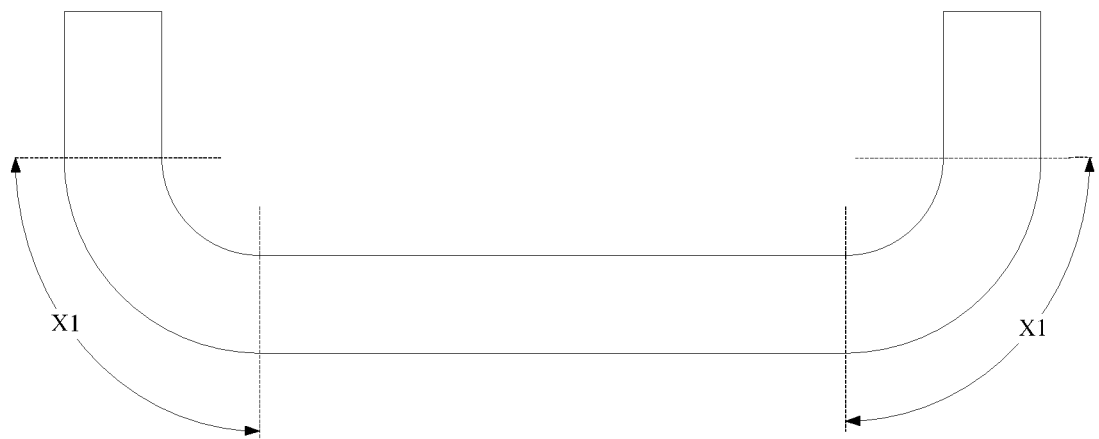
FIG. 3b is a bending diagram of a flexible display panel provided by another embodiment of the present disclosure.

In specific implementation, the flexible display panel may be unilaterally bent as shown in FIG. 3a, bilaterally bent as shown in FIG. 3b, or quadrilaterally bent. Of course, it may also be bent in other modes, which is not limited here. The bending area X1 refers to the area through which a bent shaft passes.

Figure 4:
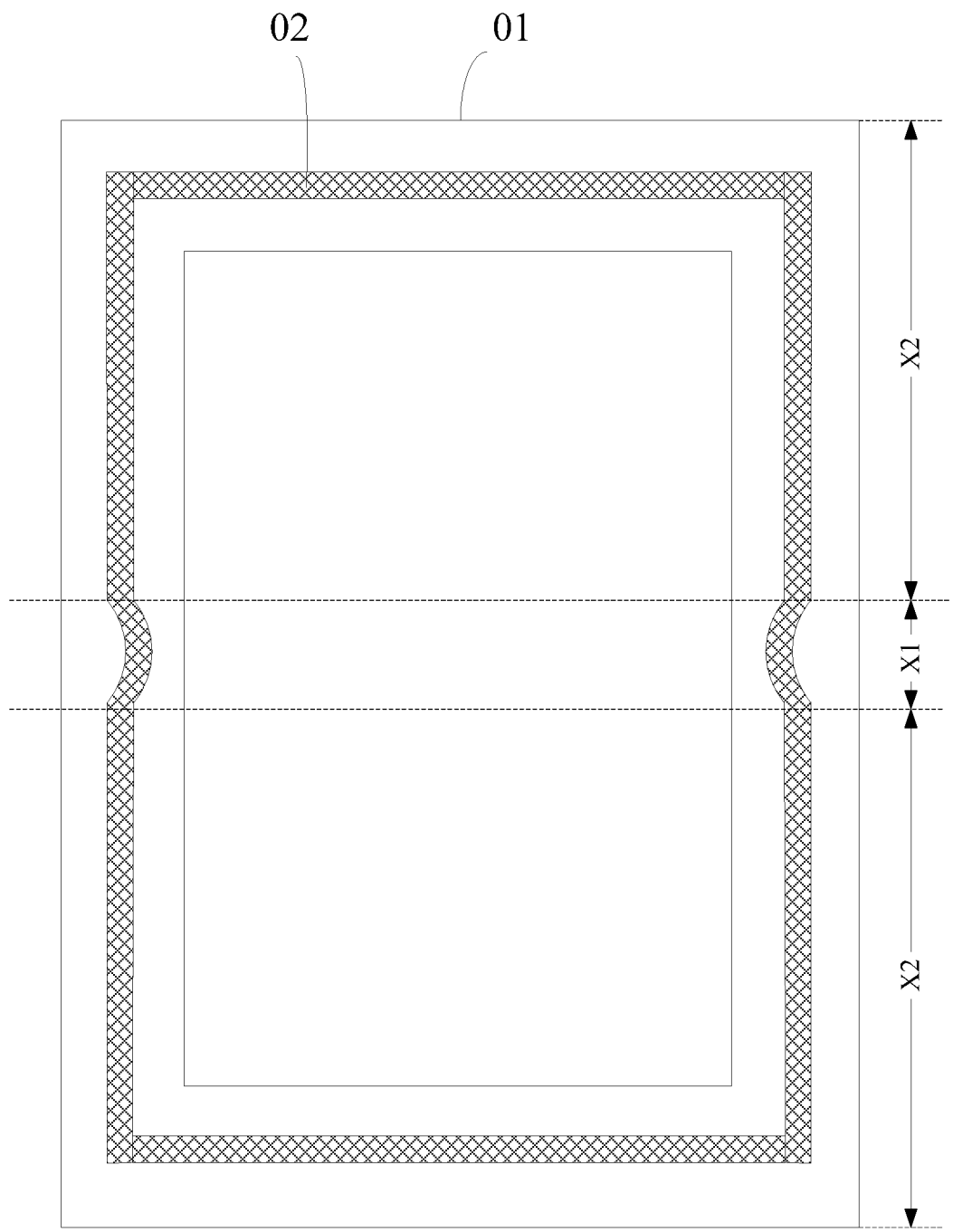
FIG. 4 is a top view structural diagram of the flexible display panel provided by another embodiment of the present disclosure.

As the stress is relatively concentrated at the edge of the flexible substrate during bending of the flexible display panel, it is optional that in the flexible display panel provided by some embodiments of the present disclosure, as shown in FIG. 4, for the same circle of the blocking wall 02, the distance between the part, in the bending area X1, of the blocking wall 02 and the edge of the flexible substrate 01 is greater than the distance between the parts, in the non-bending areas X2, of the blocking wall 02 and the edge of the flexible substrate 01. That is to say, the parts, in the bending area X1, of the blocking walls 02 are closer to the display area, so that the part, in the bending area X1, of the packaging film is closer to the display area, and far from the edge of the flexible substrate 01, which can reduce the stress on the packaging film in the bending area X1, thus further prolong the life of the packaging film.

Alternatively, in the flexible display panel provided by some embodiments of the present disclosure, as shown in FIG. 4, the parts, in the bending area X1, of the blocking walls 02 are each in an arc shape.

Figure 5A:
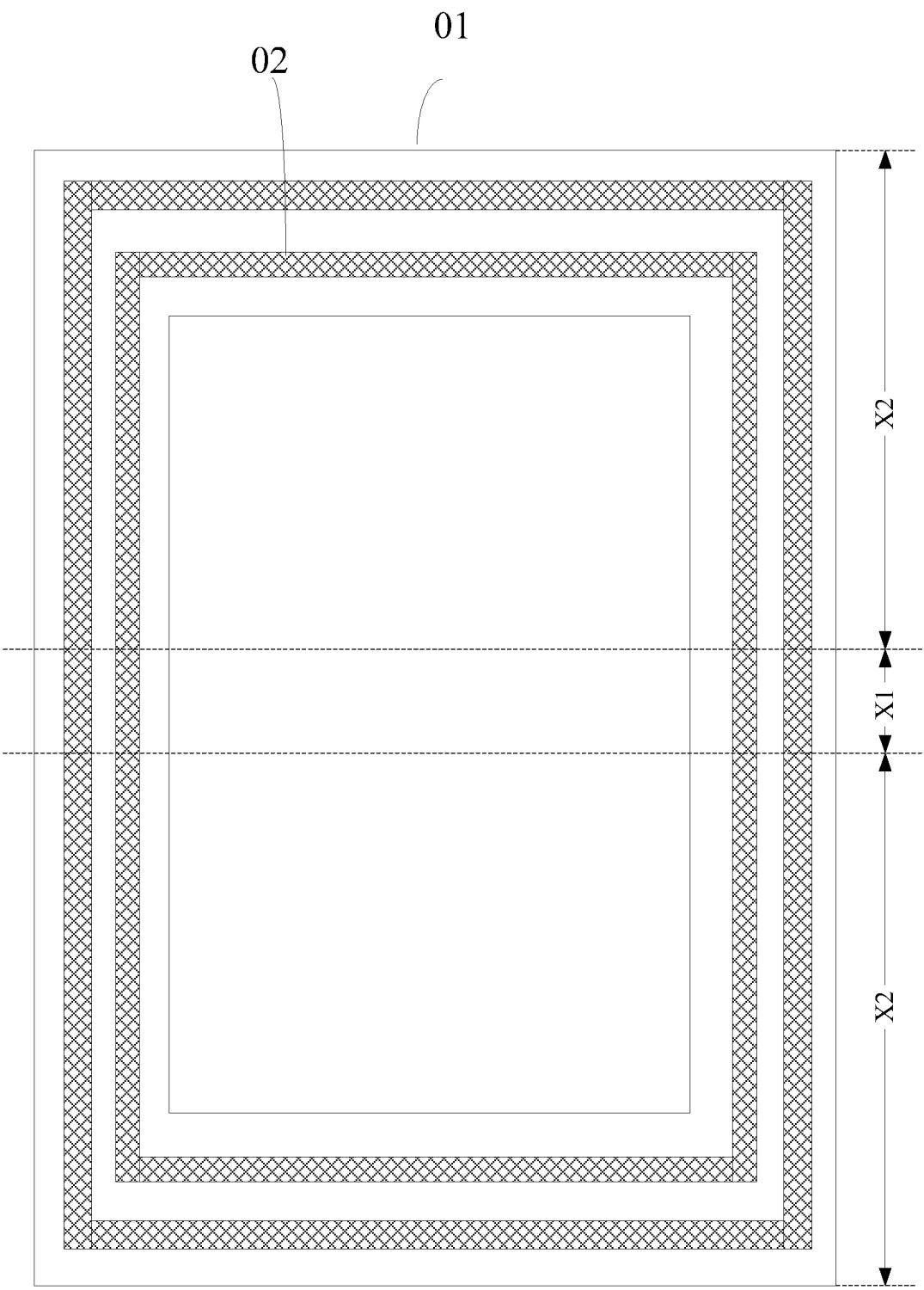
FIG. 5a is a top view structural diagram of the flexible display panel provided by another embodiment of the present disclosure.
Figure 5B:
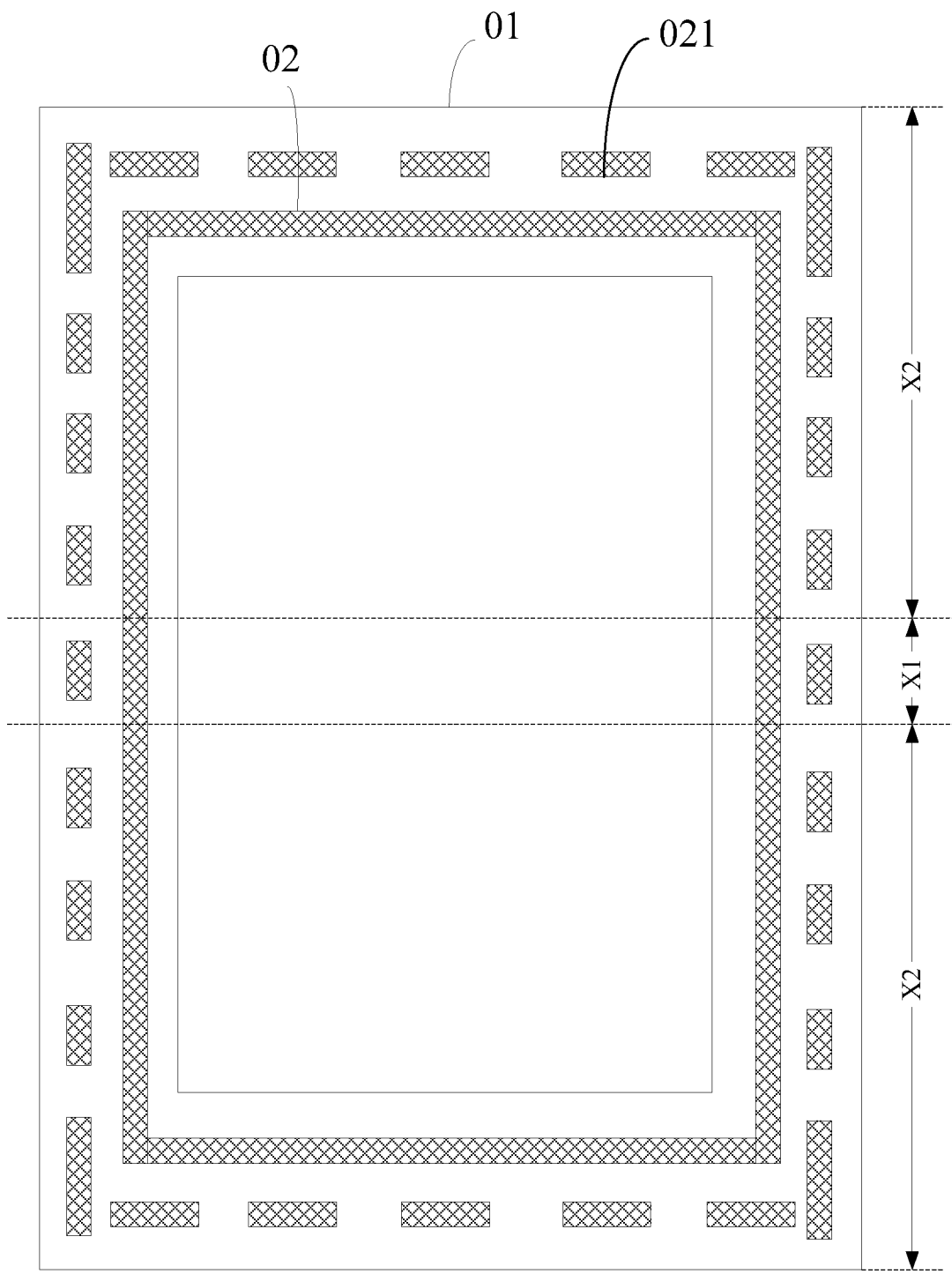
FIG. 5b is a top view structural diagram of the flexible display panel provided by another embodiment of the present disclosure.
Figure 5C:
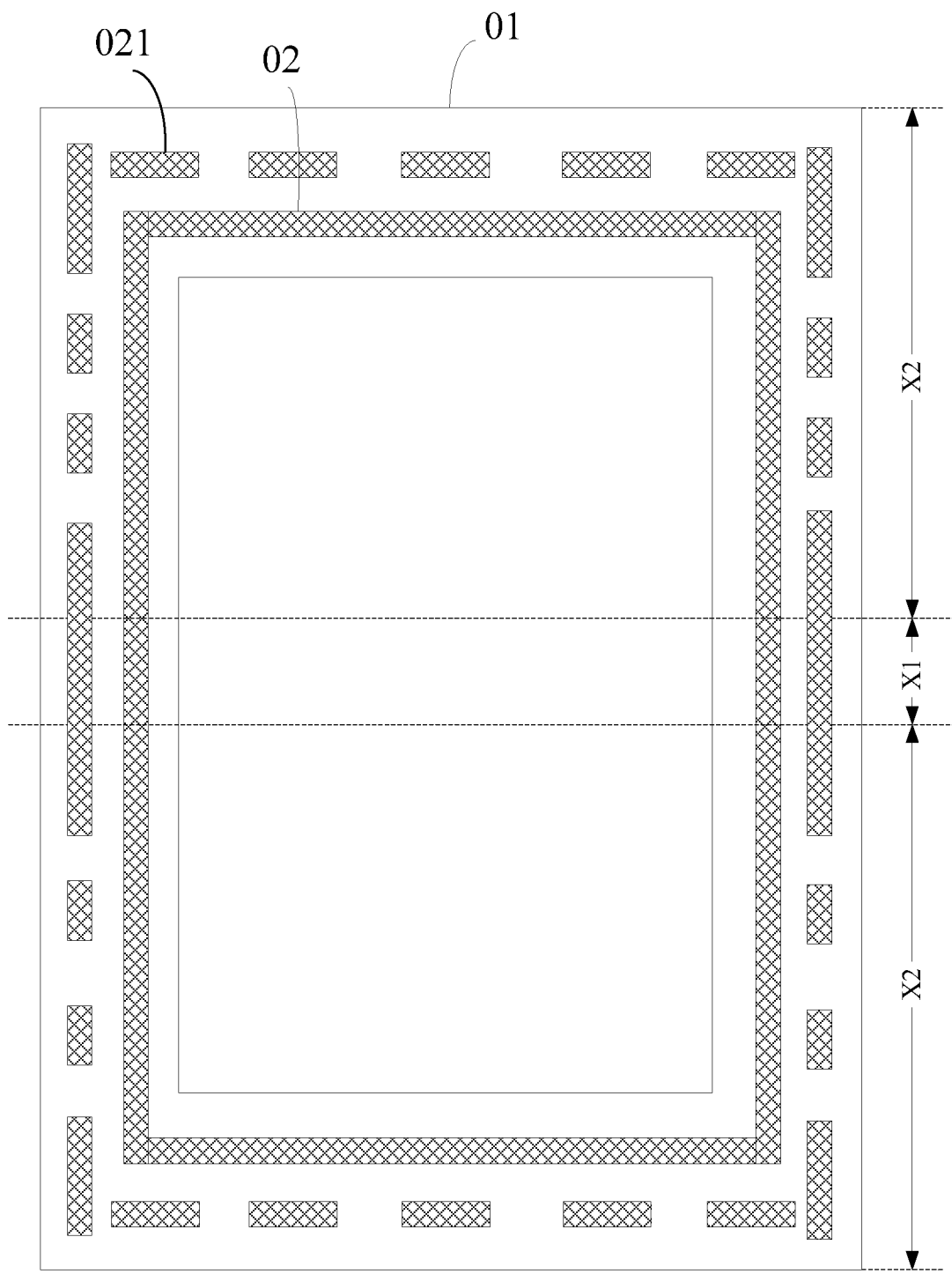
FIG. 5c is a top view structural diagram of the flexible display panel provided by another embodiment of the present disclosure.
Figure 5D:
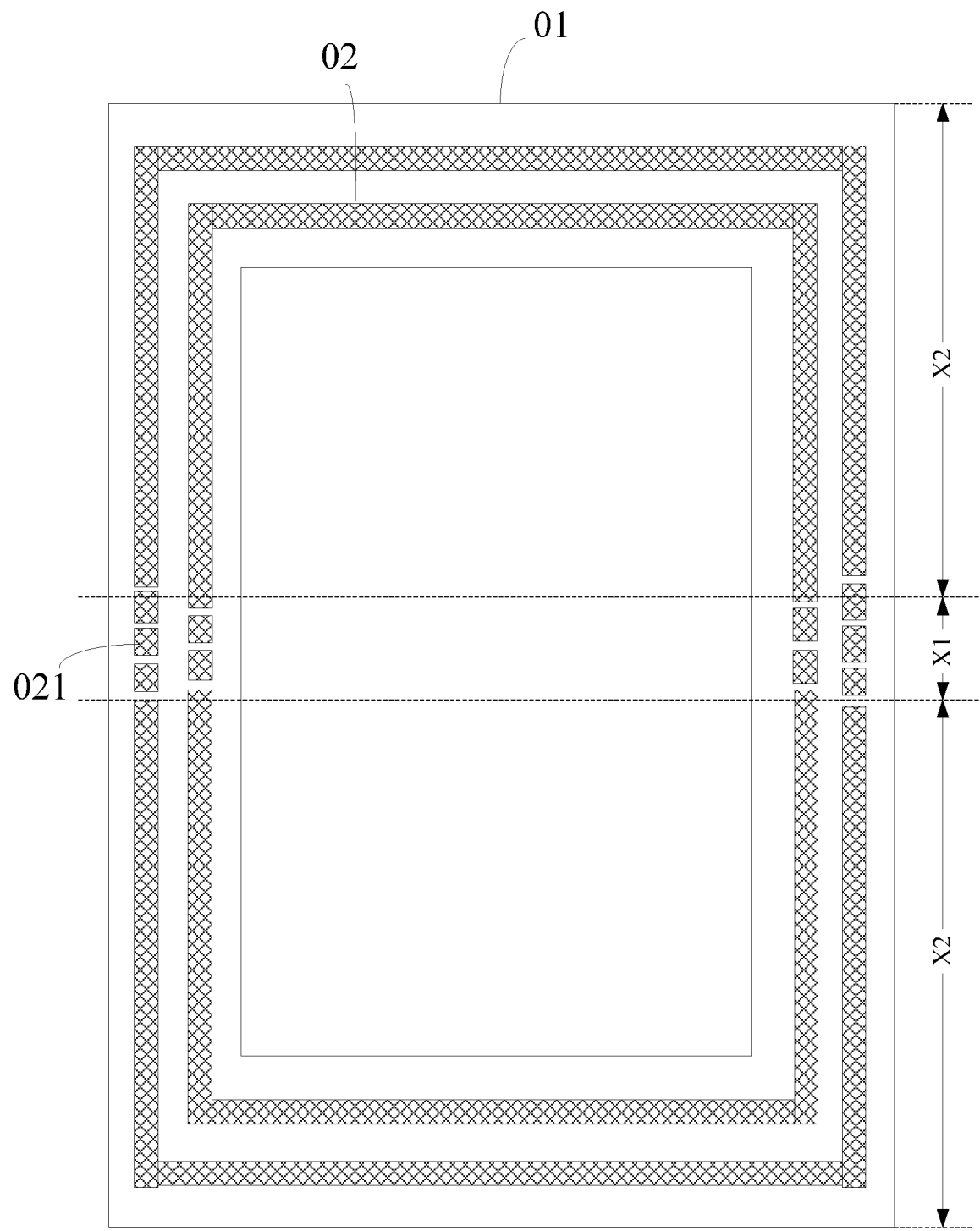
FIG. 5d is a top view structural diagram of the flexible display panel provided by another embodiment of the present disclosure.

In specific implementation, as shown in FIG. 5a to FIG. 5c, the blocking walls 02 located in the bending area X1 may be continuous, or may also be discontinuous as shown in FIG. 5d, which is not limited here.

In specific implementation, as shown in FIG. 5a and FIG. 5d, the blocking walls 02 located in the non-bending areas X2 may be continuous, or may be discontinuous as the blocking wall 02 in the outer circle shown in FIG. 5b and FIG. 5c, which is not limited here.

Of course, in specific implementation, the blocking walls located in the bending area and the blocking walls located in the non-bending areas can be continuous or disconnected from each other, which is not limited here.

Alternatively, in the flexible display panel provided by some embodiments of the present disclosure, as shown in FIG. 5a, there are two circles of the blocking walls 02, and both circles of the blocking walls 02 are in a continuous closed ring shape.

Alternatively, in the flexible display panel provided by some embodiments of the present disclosure, as shown in FIGS. 5b to 5d, there are two circles of the blocking walls 02, and at least one circle of the blocking wall 02 is composed of a plurality of blocking wall segments 021 arranged at intervals. That is to say, at least one circle of the blocking wall 02 is discontinuous.

Alternatively, in the flexible display panel provided by some embodiments of the present disclosure, as shown in FIG. 5b, the blocking wall 02 of the inner circle is in the continuous closed ring shape, and the blocking wall 02 of the outer circle is composed of the blocking wall segments 021 arranged at intervals.

Alternatively, in the flexible display panel provided by some embodiments of the present disclosure, as shown in FIG. 5d, the part, in the bending area X1, of the blocking wall 02 of the outer circle is composed of the blocking wall segments 021 arranged at intervals.

Alternatively, in the flexible display panel provided by some embodiments of the present disclosure, as shown in FIG. 5d, the two circles of blocking walls 02 are each composed of the blocking wall segments 021 arranged at intervals.

Alternatively, in the flexible display panel provided by some embodiments of the present disclosure, as shown in FIG. 5d, the parts, in the bending area X1, of the two circles of blocking walls 02, are each composed of the blocking wall segments 021 arranged at intervals.

Alternatively, in the flexible display panel provided by some embodiments of the present disclosure, the blocking wall of the outer circle is in the continuous closed ring shape, and the blocking wall of the inner circle is composed of the blocking wall segments arranged at intervals.

Alternatively, in the flexible display panel provided by some embodiments of the present disclosure, as shown in FIG. 5d, the part, in the bending area X1, of the blocking wall 02 of the inner circle is composed of the blocking wall segments 021 arranged at intervals.

Alternatively, in the flexible display panel provided by some embodiments of the present disclosure, the thickness of the blocking walls is between 0.5 µm and 2 µm, for example, 0.5 µm, 1.0 µm, 1.5 µm, 2.0 µm, etc., which is not limited here.

Alternatively, in the flexible display panel provided by some embodiments of the present disclosure, the width of the blocking walls is between 10 µm and 90 µm, such as 10 µm, 20 µm, 30 µm, 55 µm, 70 µm, 85 µm, 90 µm, etc., which is not limited here.

Alternatively, in the flexible display panel provided by some embodiments of the present disclosure, projections of the blocking walls at the edge of the display area are continuous. As shown in FIG. 1a and FIG. 4, when only one circle of the blocking wall 02 is arranged, the circle of the blocking wall 02 is in the continuous closed ring shape, ensuring that the circle surrounding the display area is protected by the blocking walls 02.

Alternatively, in the flexible display panel provided by some embodiments of the present disclosure, when at least two circles of the blocking walls are arranged, in order to ensure that the circle surrounding the display area is protected by the blocking walls 02, as shown in FIG. 5a, the two circles of blocking walls 02 can be each in the continuous closed ring shape, or, as shown in FIG. 5b to FIG. 5d, at least one circle of the blocking wall 02 is composed of the blocking wall segments 021 arranged at intervals, and the gaps between the blocking walls 021 correspond to continuous parts of at least one circle of the blocking wall 21, that is to say, the continuous parts of at least one circle of the blocking wall 02 correspond to gaps between the blocking wall segments 021, or there must be another blocking wall 02 at the gaps between the blocking wall segments 021.

Alternatively, in the flexible display panel provided by some embodiments of the present disclosure, the packaging film includes the at least one organic layer and the at least one inorganic layer stacked alternately;

the organic layer covers the display area, and the inorganic layer covers the display area and the blocking walls.

As shown in FIG. 1b, the packaging film 04 includes the first inorganic layer 041, the organic layers 042 and the second inorganic layer 043, wherein the organic layers 042 cover the display area, and the first inorganic layer 041 and the second inorganic layer 043 cover the display area and the blocking walls 02.

In specific implementation, the first inorganic layer has the water and oxygen blocking performance for keeping water vapor and oxygen out of the flexible display panel to ensure the life of the light-emitting structure. The first inorganic layer can be silicon nitride, silicon oxide, silicon oxynitride, aluminum oxide, titanium oxide and other materials, which is not limited here.

Optionally, the first inorganic layer can be prepared by Plasma Enhanced Chemical Vapor Deposition (PECVD), a sputtering method, atomic vapor deposition, vacuum evaporation, flash evaporation or transfer printing, etc., which is not limited here.

In specific implementation, the thickness of the first inorganic layer is controlled between 1000 and 10000 Em, and the refractive index is controlled between 1.5 and 2.5, which is not limited here.

In specific implementation, the covering range of the first inorganic layer shall at least include all the display area, and the distance from the edge of the first inorganic layer to the edge of the display area shall be between 0.3 mm and 2 mm.

In specific implementation, the organic layers have the functions of flattening and releasing stress. The organic layers can eliminate the height difference formed by a pixel definition layer, that is, to achieve flattening. In addition, the stress between the two inorganic layers can be eliminated by adding the organic layers.

In the flexible display panel provided by some embodiments of the present disclosure, the organic layers can be formed by means of inkjet printing, silk-screen printing, slit coating, etc., which is not limited here. The thickness of organic layers can be between 2 μm and 20 μm, for example, 2 μm, 10 μm, 15 μm, 20 μm, etc., which is not limited here.

Further, materials of the organic layers can be silicone, acrylics, polyurethanes, etc., which is not limited here.

In specific implementation, the embodiment of the second inorganic layer can refer to the embodiment of the first inorganic layer, which will not be repeated here.

As the stress is relatively concentrated at the edge of the flexible substrate during bending of the flexible display panel, it is optional that in the flexible display panel provided by some embodiments of the present disclosure, the distance between the parts, in the bending area, of the inorganic layers and the edge of the flexible substrate is greater than the distance between the parts, in the non-bending areas, of the inorganic layers and the edge of the flexible substrate. Therefore, the parts, in the bending area, of the inorganic layer parts are closer to the display area, which can reduce the stress on the inorganic layers in the bending area, and further prolong the life of the packaging film.

In specific implementation, in the flexible display panel provided by some embodiments of the present disclosure, the flexible substrate can be made of any suitable insulating material having flexibility. For example, the substrate can be made of polymer materials such as polyimide (PI), polycarbonate (PC), polyethersulfone (PES), polyethylene terephthalate (PET), polyethylene naphthalene dicarboxylate (PEN), polyaryl compound (PAR), or glass fiber reinforced plastics (FRP).

In specific implementation, the flexible substrate is further generally provided with a pixel circuit, which generally includes a plurality of thin film transistors.

The light-emitting structure is generally an organic electroluminescent structure, wherein the organic electroluminescent structure generally includes stacked anode layer, light-emitting layer and cathode layer, wherein a hole injection layer and a hole transmission layer are further generally arranged between the anode layer and the light-emitting layer, and an electron injection layer and an electron transmission layer are further generally arranged between the cathode layer and the light-emitting layer.

The flexible display panel provided by some embodiments of the present disclosure is generally made on the flexible substrate, and then the thin film transistors, the blocking walls, the light-emitting structure and the packaging film are successively prepared.

The blocking walls can be formed by photoresist through exposure development or inorganic film layers through etching; adding the blocking walls can enlarge the adhesion contact area of the lower surfaces of the inorganic layers of the packaging film, which is conducive to increase the adhesion of the packaging film at the edge of the flexible substrate and improve the packaging effect; on the other hand, adding of the blocking walls can reduce the horizontal straight-line distance between the inorganic layers and the flexible substrate, making it possible to reduce the border width of the panel.

Based on the same disclosure concept, the embodiment of the disclosure also provides a display device, including any of the above flexible display panels provided by some embodiments of the disclosure. The display device can be any product or part with display function, such as a mobile phone, a tablet computer, a television, a display, a laptop, a digital photo frame, a navigator, etc. The embodiment of the display device can refer to the embodiment of the flexible display panel, which will not be repeated here.

In the flexible display panel and the display device provided by some embodiments of the present disclosure, when the display panel is bent to the side, away from the packaging film, of the flexible substrate the packaging film is in the stretched state, and since the thickness of the parts, in the bending area, of the blocking walls is less than the thickness of the parts, in the non-bending areas, of the blocking walls, the part, in the bending area, of the packaging film is closer to the neutral layer than the parts, in the non-bending areas, of the packaging film, thereby reducing the stretching stress on the part, in the bending area, of the packaging film for lowering the probability of the cracks in the packaging film. When the display panel is bent to the side, away from the flexible substrate, of the packaging film, the packaging film is in the compressed state, and since the thickness of the parts, in the bending area, of the blocking walls is greater than the thickness of the parts, in the non-bending areas, of the blocking walls, the part, in the bending area, of the packaging film is closer to the neutral layer than the parts, in the non-bending areas, of the packaging film, thereby reducing the compressing stress on the part, in the bending area, of the packaging film for lowering the probability of the cracks in the packaging film.

Obviously, those skilled in the art can make various changes and modifications to the disclosure without departing from the spirit and scope of the disclosure. Thus, if these modifications and variations of the present disclosure fall within the scope of the claims of the present disclosure and its equivalent technology, the present disclosure also intends to include these modifications and variations.

The invention claimed is:

1. A flexible display panel, comprising a flexible substrate having a display area and a non-display area surrounding the display area, and further comprising at least one blocking wall located on the non-display area and surrounding the display area, wherein the non-display area comprises a bending area and a non-bending area, and a thickness of parts, in the bending area, of the blocking wall is not equal to a thickness of parts, in the non-bending areas, of the blocking wall.

2. The flexible display panel of claim 1, wherein the flexible display panel is bent to a side, away from the blocking wall, of the flexible substrate, a thickness of the parts, in the bending area, of the blocking wall is less than a thickness of the parts, in the non-bending areas, of the blocking wall, or, the flexible display panel is bent to a side, away from the flexible substrate, of the blocking wall, and a thickness of the parts, in the bending area, of the blocking wall is greater than a thickness of the parts, in the non-bending areas, of the blocking wall.

3. The flexible display panel of claim 2, wherein a distance between a part, in the bending area, of the blocking wall and an edge of the flexible substrate is greater than a distance between a part, in the non-bending areas, of the blocking wall and the edge of the flexible substrate.

4. The flexible display panel of claim 3, wherein projections of parts, in the bending area, of the blocking wall are in an arc shape.

5. The flexible display panel of claim 1, comprising two blocking walls, and the two blocking walls are in a continuous closed ring shape.

6. The flexible display panel of claim 1, comprising two blocking walls, and at least one of the blocking walls is composed of a plurality of blocking wall segments arranged at intervals.

7. The flexible display panel of claim 6, wherein an inside blocking wall of the two blocking walls is in the continuous closed ring shape, and an outside blocking wall of the two blocking walls is composed of the blocking wall segments arranged at intervals.

8. The flexible display panel of claim 7, wherein a part, in the bending area, of the outside blocking wall is composed of the blocking wall segments arranged at intervals.

9. The flexible display panel of claim 6, wherein the two blocking walls are composed of the blocking wall segments arranged at intervals.

10. The flexible display panel of claim 6, wherein the parts, in the bending area, of the two circles of blocking walls are each composed of the blocking wall segments arranged at intervals.

11. The flexible display panel of claim 6, wherein an outside blocking wall of the two blocking walls is in the continuous closed ring shape, and an inside blocking wall of the two blocking walls is composed of the blocking wall segments arranged at intervals.

12. The flexible display panel of claim 11, wherein a part, in the bending area, of the inside blocking wall is composed of the blocking wall segments arranged at intervals.

13. The flexible display panel of claim 1, wherein a thickness of the blocking wall is 0.5 μm~2 μm.

14. The flexible display panel of claim 1, wherein a width of the blocking wall is 10 μm~90 μm.

15. The flexible display panel of claim 1, comprising a plurality of blocking walls, at least one of the plurality blocking walls is composed of a plurality of blocking wall segments arranged at intervals, and gaps between the blocking wall segments correspond to continuous parts of at least one of blocking walls.

16. The flexible display panel of claim 1, further comprising a packaging film located on sides, away from the flexible substrate, of the blocking wall, wherein the packaging film comprises at least one organic layer and at least one inorganic layer stacked alternately, the organic layer cover the display area, and the inorganic layer cover the display area and the blocking wall.

17. The flexible display panel of claim 16, wherein a distance between parts, in the bending area, of the inorganic layer and an edge of the flexible substrate is greater than a distance between parts, in the non-bending areas, of the inorganic layer and the edge of the flexible substrate.

18. A display device, comprising the flexible display panel of claim 1.

* * * * *